United States Patent
Gries et al.

(10) Patent No.: US 6,171,462 B1
(45) Date of Patent: Jan. 9, 2001

(54) DEVICE FOR HOLDING LENSES, ESPECIALLY FOR EYE GLASSES TO BE COATED IN A VACUUM COATING OR SPUTTERING MACHINE

(75) Inventors: Herbert Gries, Mömbris; Stefan Locher, Alzenau, both of (DE)

(73) Assignee: Balzer und Leybold Deutschland Holding AG, Hanau (DE)

( * ) Notice: Under 35 U.S.C. 154(b), the term of this patent shall be extended for 0 days.

(21) Appl. No.: 09/310,109

(22) Filed: May 12, 1999

(30) Foreign Application Priority Data

May 16, 1998 (DE) ............................................. 198 22 064

(51) Int. Cl.[7] ........................... C23C 14/50; C23C 14/34; C23C 16/458
(52) U.S. Cl. ..................... 204/298.15; 118/720; 118/729; 118/730; 118/500
(58) Field of Search ..................... 204/298.15; 118/720, 118/729, 730, 500

(56) References Cited

U.S. PATENT DOCUMENTS

| | | | |
|---|---|---|---|
| 3,859,956 | * 1/1975 | Paola | 118/720 |
| 4,380,212 | 4/1983 | Kraus | 118/720 |
| 4,449,478 | * 5/1984 | Kraus | 118/720 |
| 5,026,469 | * 6/1991 | Kunkel et al. | 118/730 |
| 5,138,974 | * 8/1992 | Cipaisso | 118/731 |

FOREIGN PATENT DOCUMENTS

| | | |
|---|---|---|
| 132981 | 11/1978 | (DE) . |
| 37 15 831 | 2/1988 | (DE) . |
| 3921672 | * 1/1991 | (DE) . |
| 959147 | * 11/1999 | (EP) . |

OTHER PUBLICATIONS

Patent Abstracts of Japan, C–938, May 11, 1992, vol. 16, No. 194, 4–28859, Jan. 31, 1992.

* cited by examiner

Primary Examiner—Alan Diamond
(74) Attorney, Agent, or Firm—Smith, Gambrell & Russell, LLP

(57) ABSTRACT

In a device for holding lenses for eye glasses to be coated (3,3', ... ) with a substrate holder (4) consisting of cap-like sheet-metal blanks (4a,b,c,d) forming a dish in the form of a spherical segment and having several drill-holes (5,5', ... ), rotating on a vertical axis (R) in the vacuum chamber (2) above a coating source (Q), the coating source (Q) being mounted to the side of the axis of rotation (R) and the lenses (3,3', ... ) being placed and held in the drill-holes (5,5', ... ), the mean perpendicular (M) of the respective drill-hole longitudinal axis (A) intersects the axis of rotation (R) of the substrate holder (4) at a point (O) roughly halfway between the two locations which are the points of intersection (C,F) of the mean perpendiculars (M',M") of two notional drill-holes of the same drill-hole pitch circle (T) with the axis of rotation (R), whose drill-hole longitudinal axes (A',A") intersect the coating source (Q), the one notional drill-hole however having the largest and the other notional drill-hole having the shortest distance from the coating source (Q).

5 Claims, 3 Drawing Sheets

DEVICE FOR HOLDING LENSES, ESPECIALLY FOR EYE GLASSES TO BE COATED IN A VACUUM COATING OR SPUTTERING MACHINE

INTRODUCTION AND BACKGROUND

The present invention relates to a device for holding lenses, especially eye glasses to be coated in a vacuum coating or sputtering machine, with a substrate holder consisting of cap-like sheet-metal blanks forming a dish in the form of a spherical segment, and with numerous drill-holes, that is mounted in the vacuum chamber above a coating source, revolving on a vertical axis, with the coating source mounted to the side of the axis of rotation, the lenses being placed in the drill holes and held and centered in the drill holes.

A device of the type in question is disclosed (U.S. Pat. No. 3,859,956) in which the lenses to be coated are inserted in rings which are in turn held by a frame located at a distance above the coating source. The rings can be tilted relative to the frame, in such a way that the lenses can be aligned with their curved surfaces towards the source. In this device the axis of rotation of the frame runs plumb through the source.

Another device is disclosed (DE-OS 39 21 672) for holding and turning lenses, specially for eye glasses to be coated in a high-vacuum coating machine or sputtering machine, with a pair of rings supporting the lens to be held. These, in turn, can be connected to a substrate holder that is held in the process chamber of the high-vacuum machine, with the cap-like or half-dish-shaped metal sheet forming the substrate holder at least partly overlapped by a sickle-shaped sheet-metal blank or sectional element forming a slide or rake. The edge of the rake facing towards the substrate holder is held a small distance away from the outer surface of the substrate holder by a slider or articulated arm, the rake being movable in this position relative to the top side of the substrate holder around the axis of rotation of the substrate holder.

A vacuum coating machine has also been proposed for depositing blooming coats on optical substrates (DE-OS 37 15 831) such as plastic eye lenses, that can be clamped on carriers rotating in an evacuatable container above evaporating sources. The carriers include a majority of flat carrier plates that are at least approximately in the shape of a segment of a circle, which are supported in a dome shape relative to each other and can each turn through 180° at a common supporting axis of rotation. Each carrier plate has a majority of substrate mountings with at least one holding spring in the opening areas, of which at least one can tilt freely to both sides from the carrier plate plane up to a predetermined angle.

Finally a device has been disclosed (U.S. Pat. No. 4,449, 478) for coating lens-shaped substrates including a cap-like substrate holder with several drill-holes arranged on two pitch circles to hold the lenses. The drill-holes are all aligned to the source located below the substrate holder, in such a way that the longitudinal axes of the drill-holes all intersect at the vertical axis of rotation of the substrate holder at one point. The coating source is located comparatively close to the point of intersection of the longitudinal axis.

An object of the present invention is to create a device of the type discussed above that enables largely even coating, even with machines in which the coating source is located not centrally beneath the substrate holder, but off center, near the axis of rotation of the cap-like substrate body. The device is also intended to be adjustable to the peculiarities of a coating source, for example the form of the "vaporization beam".

SUMMARY OF THE INVENTION

These and other objects can be achieved according to the device disclosed by this invention having the drill-holes enclosing and centering the rotating cylindrical rims of the lenses roughly aligned towards the coating source, with the mean perpendicular of the drill-hole longitudinal axis concerned intersecting the axis of rotation of the substrate holder at a point located roughly centrally between two points that are the points of intersection of the mean perpendiculars of two notional drill-holes of the same drill-hole pitch circle with the axis of rotation whose drill-hole longitudinal axes intersect the coating source, but with a notional drill-hole having the largest distance from the coating source and the other notional drill-hole having the shortest distance from the coating source.

The oblique coatings that normally occur when coating spherical surfaces of lenses, the so-called half-moon effects, are to a large extent reduced by tilting the lenses in respect of the surface of the substrate holder through a certain angle.

BRIEF DESCRIPTION OF DRAWINGS

The present invention will be further understood with reference to the accompanying drawings, wherein.

DETAILED DESCRIPTION OF INVENTION

The present invention will now be described in greater detail.

Figure 1:
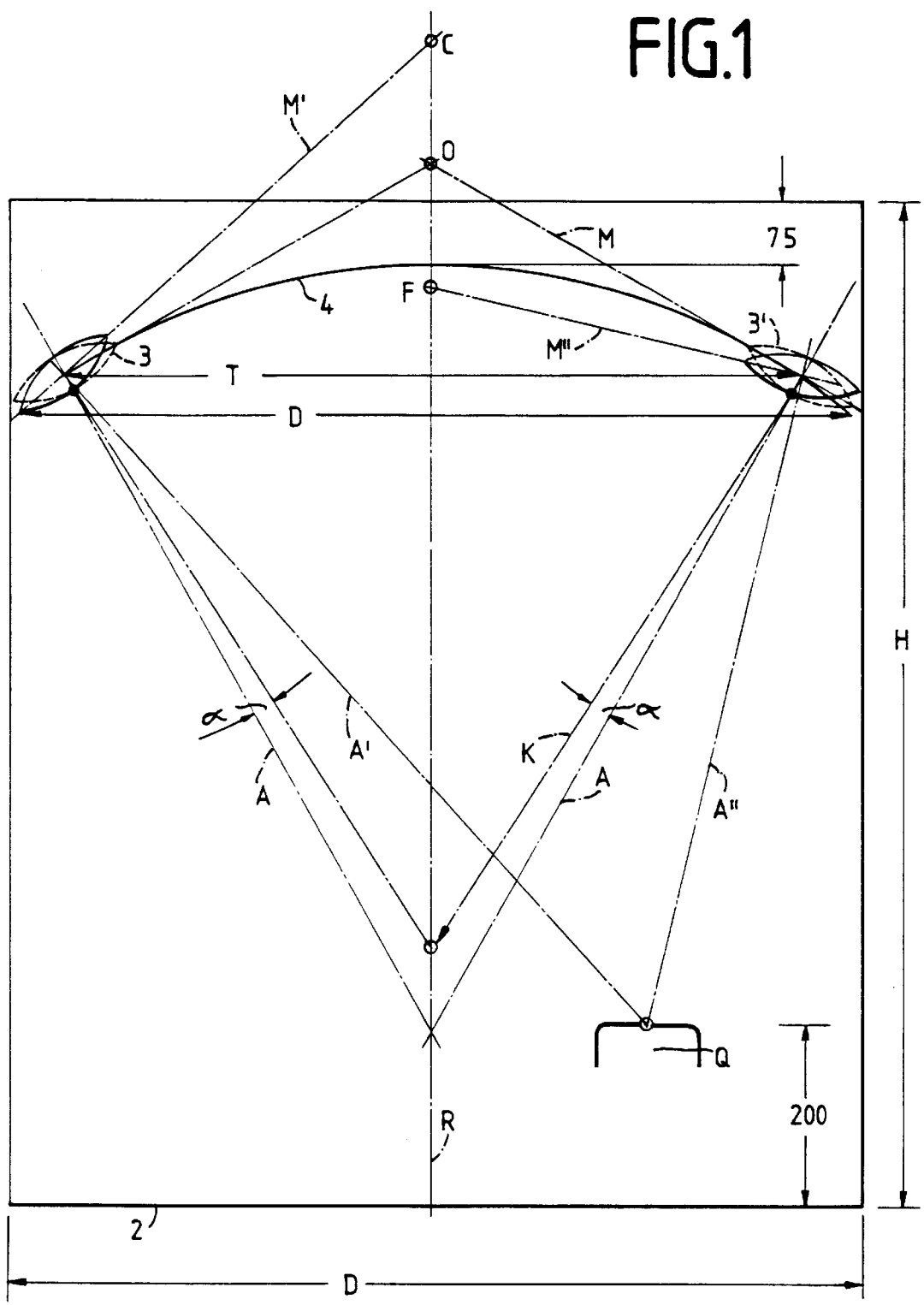
FIG. 1 is a schematic representation of the spatial formation underlying the device of the invention.

The substrate holder 4 consists principally of 4 equal sheet-metal blanks 4a, b, c, d, that together form a shell in the shape of a spherical segment that revolves on the vertical axis R in the vacuum chamber 2. As shown in FIG. 1, the crown of the shell-shaped substrate holder 4 or its radius of curvature K is somewhat smaller than the diameter D of the substrate holder 4. All drill-holes 5,5', . . . of a pitch circle T, T', . . . are aligned roughly to the coating source Q, whereby the mean perpendicular M of the respective drill-hole longitudinal axis A or the straight line perpendicular to the optical axis between the two curved surfaces of the lens intersects the axis of rotation R of the substrate holder 4 at a point O located roughly half-way between two locations. The two locations are the points of intersection C, F of the mean perpendicular M',M" of two notional drill-holes of the same drill-hole pitch circle T with the axis of rotation R. The drill-hole longitudinal axes A',A" intersect the coating source. The one notional drill-hole however having the largest distance from the coating source Q and the other notional drill-hole having the shortest distance from the coating source Q.

Figure 2:
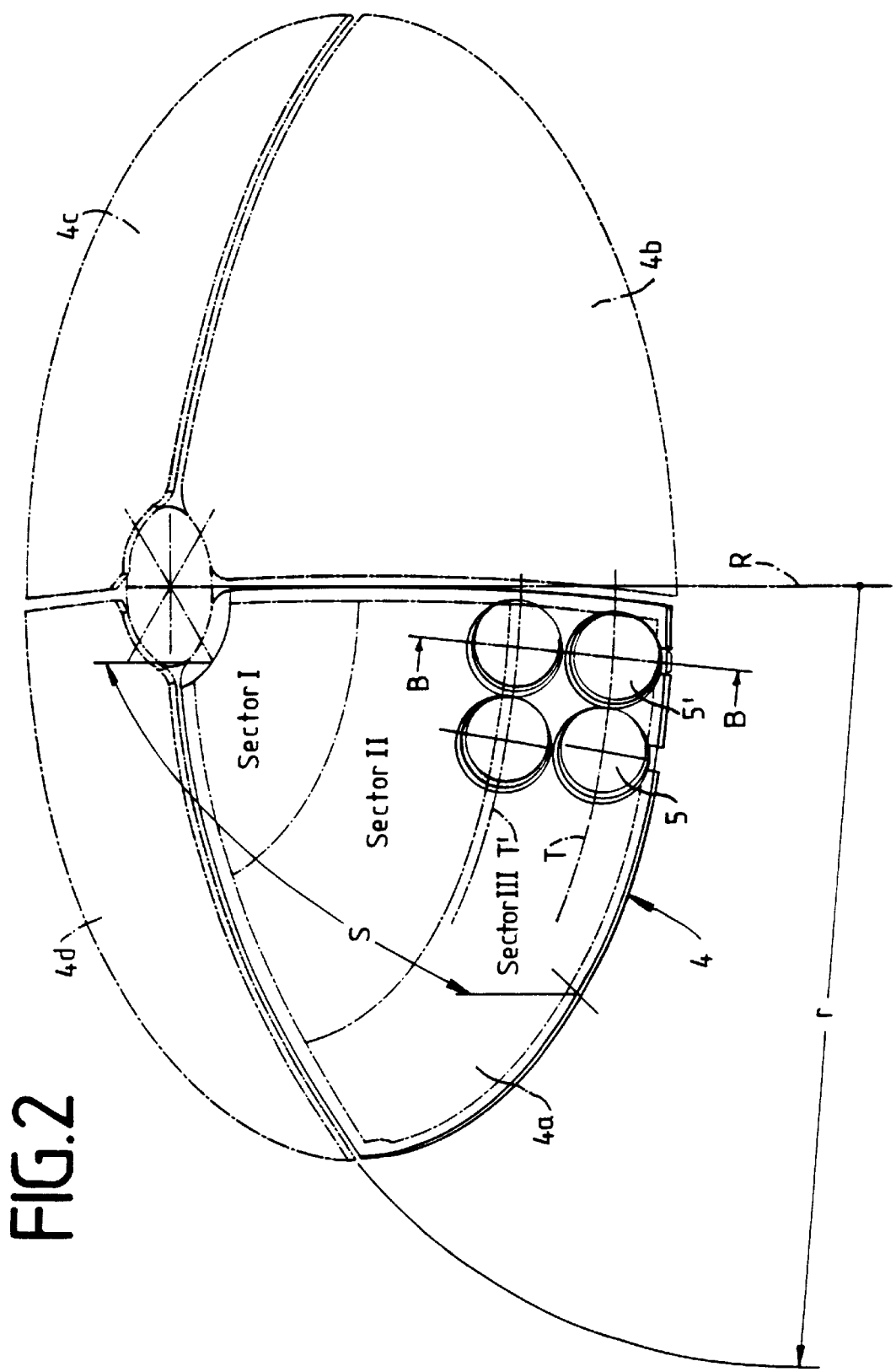
FIG. 2 is a perspective view of a substrate holder in the form of 4 half-shell-shaped sheet-metal parts with several drill-holes.
Figure 3:
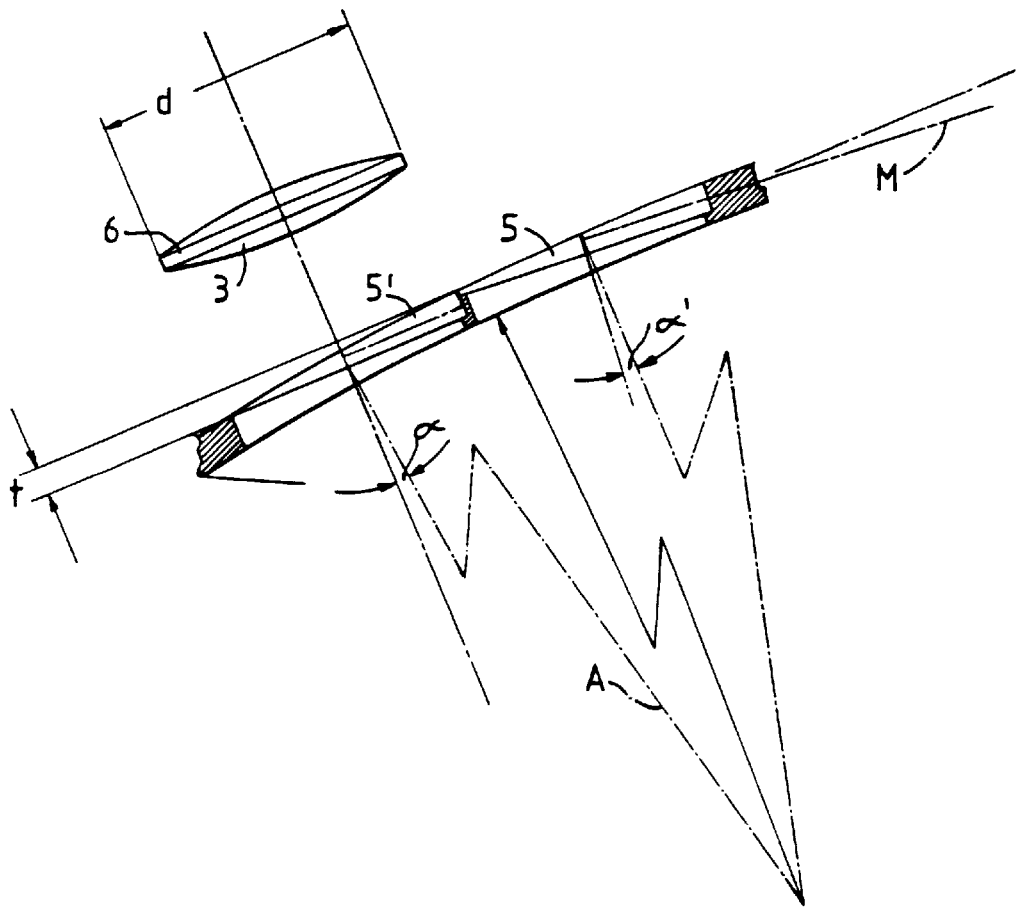
FIG. 3 is a partial section view according to the section B—B as per FIG. 2.
Figure 4:
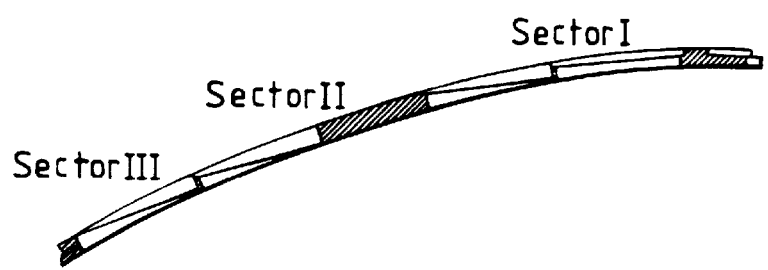
FIG. 4 is a section view S through the 3 sectors of a sheet-metal part as per FIG. 2.

As shown in FIG. 2, the substrate holder 4 comprises 4 equal sheet-metal blanks 4a,b,c,d, each of these four sheet-metal blanks being divided into three zones I to III, the respective (approximate) correction angles α being listed in a table for each sector. These correction angles α are derived for the various pitch circles T,T', . . . or sectors, two of which are indicated in FIG. 2. Depending on the lens diameter specified, more or fewer pitch circles T,T', . . . can be provided, the corrective value of the sector I to III in which the pitch circle falls being provided for each of the drill-holes 5,5', . . . (The four drill-holes 5,5', . . . indicated in FIG. 2 are accordingly all allocated to sector III.)

The following tables list examples of the main dimensions of coating machines, the second table giving the correction angle α for a machine with a substrate holder 4 with a radius of curvature K of 750 mm in length and for lenses with a diameter d=65 mm, the angles α, . . . being corrected in each case by a small amount that is derived from the form and size of the plasma cloud (vapor beam) of a particular vaporization source, and is determined in series of practical trials.

Further variations and modifications of the foregoing will be apparent to those skilled in the art and are intended to be encompassed by the claims appended hereto.

German priority application 198 22 064.2 is relied on and incorporated herein by reference.

| φD | H | K |
|---|---|---|
| 550 | 580 | 400 |
| 725 | 710 | 500 |
| 950 | 1110 | 750 |
| 1110 | 1110 | 750 |
| 1500 | 1500 | 1000 |

| Sector | I | II | III |
|---|---|---|---|
| α [°] | 1.5 | 4.0 | 5.5 |
| t [mm] | 0.9–0.2 | 2.3–0.2 | 3.2–0.2 |

We claim:

1. A device for holding lenses to be coated in a vacuum coating machine or sputtering machine, comprising a substrate holder having cap-shaped sheet-steel blanks forming a dish in the form of a spherical segment and having a plurality of drill-holes, wherein the substrate holder is rotatable around a vertical axis (R), for mounting in the vacuum chamber above a coating source (Q), the coating source (Q) being mounted to a side of the axis of rotation (R) and the drill-holes receiving the lenses to be held and centered in the drill-holes during vacuum coating, wherein the drill-holes are to enclose and center rotatable cylindrical rims of the lenses each being oriented towards the coating source (Q) when the lenses are mounted in said device, the mean perpendicular (M) of a respective drill-hole longitudinal axis (A) intersecting the axis of rotation (R) of the substrate holder at a point that lies halfway between two points that are the points of intersection (C,F) of the mean perpendiculars (M',M") of two notional drill-holes of the same drill-hole pitch circle (T) with the axis of rotation (R), whose drill-hole longitudinal axes (A',A") intersect the coating source (Q), one notional drill-hole having the largest and the other notional drill-hole the shortest distance from the coating source (Q).

2. The device according to claim 1 wherein the drill-holes are in the form of concentric two-stage drill-holes, the first drill-hole stage turned away from the coating source (Q) being slightly larger, corresponding to the external diameter of the lenses.

3. The device according to claim 1 wherein all drill-holes located on a pitch circle include the same angle (α) with the axis of rotation (R).

4. The device according to claim 1 wherein all drill-holes oriented towards the coating source are changed by an additional correction angle to the mounting of the lenses in their angular position (α) relative to the axis of rotation (R), as a function of the output of the coating source (Q).

5. The device according to claim 4 wherein at least one drill hole is oriented as a function of a form and size of a plasma cloud in the vacuum coating machine, this correction angle reducing as the plasma cloud increases in size, and vice versa.

* * * * *